(12) United States Patent
Zhang et al.

(10) Patent No.: US 11,537,180 B2
(45) Date of Patent: Dec. 27, 2022

(54) ELECTRONIC ASSEMBLY HAVING ENGAGEMENT COMPONENT FOR FIXING EXPANSION CARD ON MOTHERBOARD

(71) Applicants: Inventec (Pudong) Technology Corporation, Shanghai (CN); INVENTEC CORPORATION, Taipei (TW)

(72) Inventors: Shuai Zhang, Shanghai (CN); Xiaogang Lu, Shanghai (CN)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 0 days.

(21) Appl. No.: 17/349,277

(22) Filed: Jun. 16, 2021

(65) Prior Publication Data
US 2022/0374056 A1    Nov. 24, 2022

(30) Foreign Application Priority Data

May 24, 2021  (CN) .......................... 202110567309.9

(51) Int. Cl.
    *G06F 1/18*    (2006.01)
(52) U.S. Cl.
    CPC .................... *G06F 1/185* (2013.01)

(58) Field of Classification Search
CPC ....... G06F 1/185; G06F 1/186; H05K 7/1417; H05K 7/12; H05K 5/0286
See application file for complete search history.

(56) References Cited

U.S. PATENT DOCUMENTS

| | | | |
|---|---|---|---|
| 8,413,945 B2* | 4/2013 | Chen | G06F 1/185 248/500 |
| 9,930,781 B2* | 3/2018 | Takai | H01R 12/7076 |
| 2021/0153373 A1* | 5/2021 | Chen | H05K 5/0286 |

* cited by examiner

*Primary Examiner* — James Wu
(74) *Attorney, Agent, or Firm* — Locke Lord LLP; Tim Tingkang Xia, Esq.

(57) ABSTRACT

An electronic assembly including motherboard, first slide rail, second slide rail, expansion card and engagement component. Motherboard includes main circuit board and first connector. First and second slide rails are fixed on main circuit board. First slide rail has first engagement hole. Expansion card includes expansion circuit board and second connector. Expansion circuit board is disposed on first and second slide rails and has first positioning recess. Second connector is plugged into first connector. Engagement component includes connecting portion, first movable end portion, second movable end portion, first protruding portion, and second protruding portion. First and second movable end portions are respectively connected to two opposite sides of connecting portion. First protruding portion protrudes from first movable end portion and is removably engaged with first positioning recess. Second protruding portion protrudes from second movable end portion and is removably engaged with first engagement hole.

9 Claims, 6 Drawing Sheets

ELECTRONIC ASSEMBLY HAVING ENGAGEMENT COMPONENT FOR FIXING EXPANSION CARD ON MOTHERBOARD

CROSS-REFERENCE TO RELATED APPLICATIONS

This non-provisional application claims priority under 35 U.S.C. § 119(a) on Patent Application No(s). 202110567309.9 filed in China, on May 24, 2021, the entire contents of which are hereby incorporated by reference.

BACKGROUND OF THE INVENTION

Technical Field of the Invention

The invention relates to an electronic assembly, more particularly to an electronic assembly including a main circuit board with slide rails fixed thereon.

Description of the Related Art

In general, a network card meeting the Open Compute Project (OCP) specification is mounted on the motherboard via slide rails and is plugged into a connector fixed on the motherboard. In addition, in order to maintain the connection between the network card and the connector, the network card is commonly fixed to a chassis accommodating the motherboard via a fastening structure.

However, the fastening structure needs to protrude outward from the chassis in order to be operated by hand for the removal of the network card. Thus, there may be a risk that the fastening structure is unexpectedly moved and thus cause the network card to be unexpectedly removed from the connector, thereby damaging the network card and the connector or even the motherboard.

SUMMARY OF THE INVENTION

The invention is to provide an electronic assembly preventing the expansion circuit board from being unexpectedly removed from the connector fixed on the motherboard.

One embodiment of this invention provides an electronic assembly including a motherboard, a first slide rail, a second slide rail, an expansion card and at least one engagement component. The motherboard includes a main circuit board and a first connector. The first connector is fixed on and electrically connected to the main circuit board. The first slide rail and the second slide rail are fixed on the main circuit board. The first slide rail has a first engagement hole. The expansion card includes an expansion circuit board and a second connector. The second connector is fixed on and electrically connected to the expansion circuit board. The expansion circuit board is disposed on the first slide rail and the second slide rail and has a first positioning recess. The second connector is plugged into the first connector of the motherboard. The at least one engagement component includes a connecting portion, a first movable end portion, a second movable end portion, a first protruding portion, and a second protruding portion. The first movable end portion and the second movable end portion are respectively connected to two opposite sides of the connecting portion. The first protruding portion protrudes from the first movable end portion and is removably engaged with the first positioning recess of the expansion circuit board. The second protruding portion protrudes from the second movable end portion and is removably engaged with the first engagement hole of the first slide rail.

According to the electronic assembly disclosed by the above embodiment, the first protruding portion of the engagement component is engaged with the first positioning recess of the expansion circuit board and the second protruding portion of the engagement component is engaged with the first engagement holes of the first slide rail. Thus, the expansion circuit board can be stably mounted on the first slide rail and the second slide rail.

Also, the expansion circuit board is fixed to the slide rails via the engagement component instead of being fixed to the chassis, such that the engagement component is not required to protrude out of the chassis, thereby preventing the engagement component from being unexpectedly moved and thus preventing the expansion circuit board from being unexpectedly removed from the first connector.

Moreover, the engagement component can be installed on or removed from the first slide rail and the expansion circuit board by squeezing the first movable end portion and the second movable end portion, such that the installation and removal of the expansion circuit board is convenient and tool-less.

Additionally, the first slide rail and the second slide rail can provide installation for various types of the expansion circuit board.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
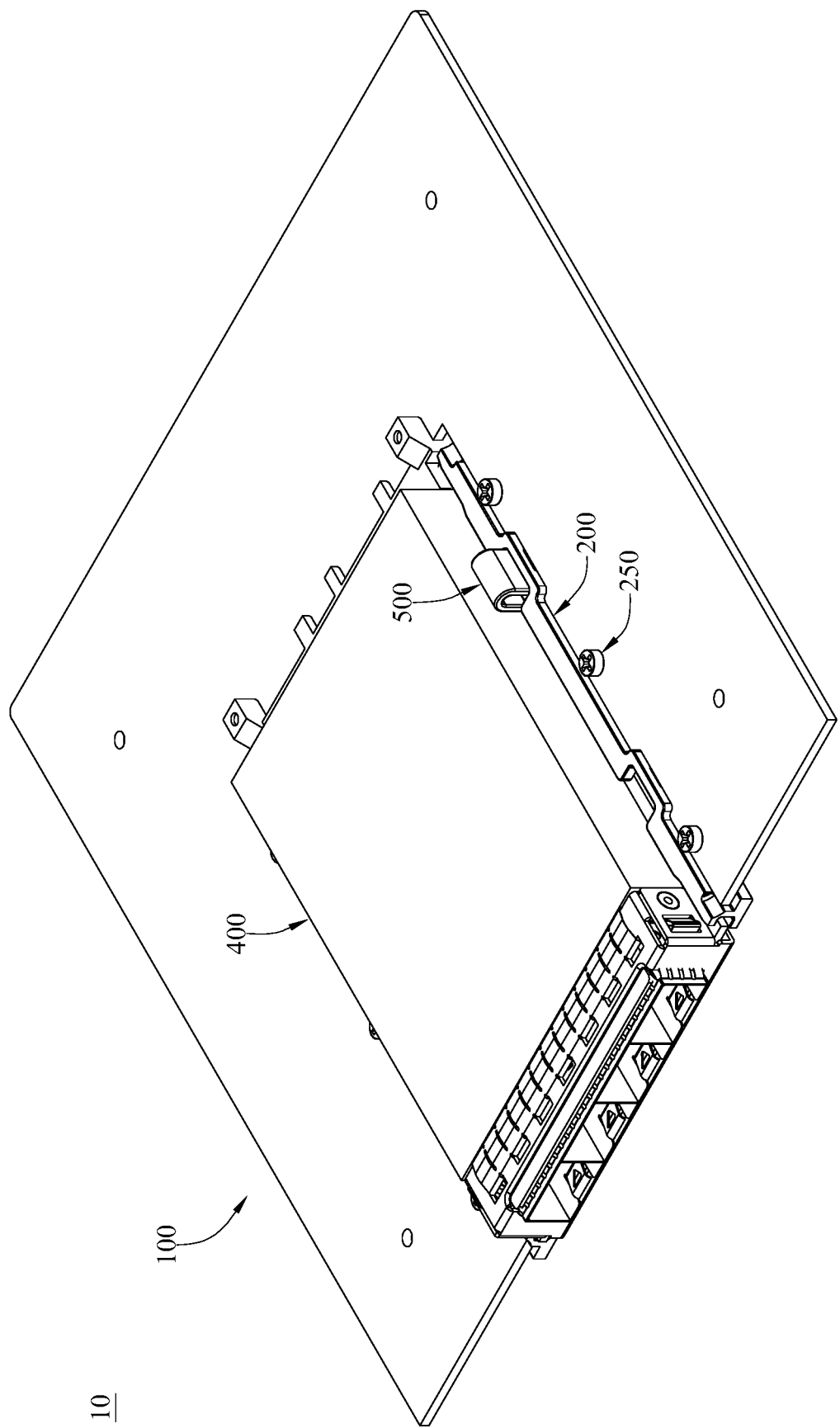
FIG. 1 is a perspective view of an electronic assembly according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
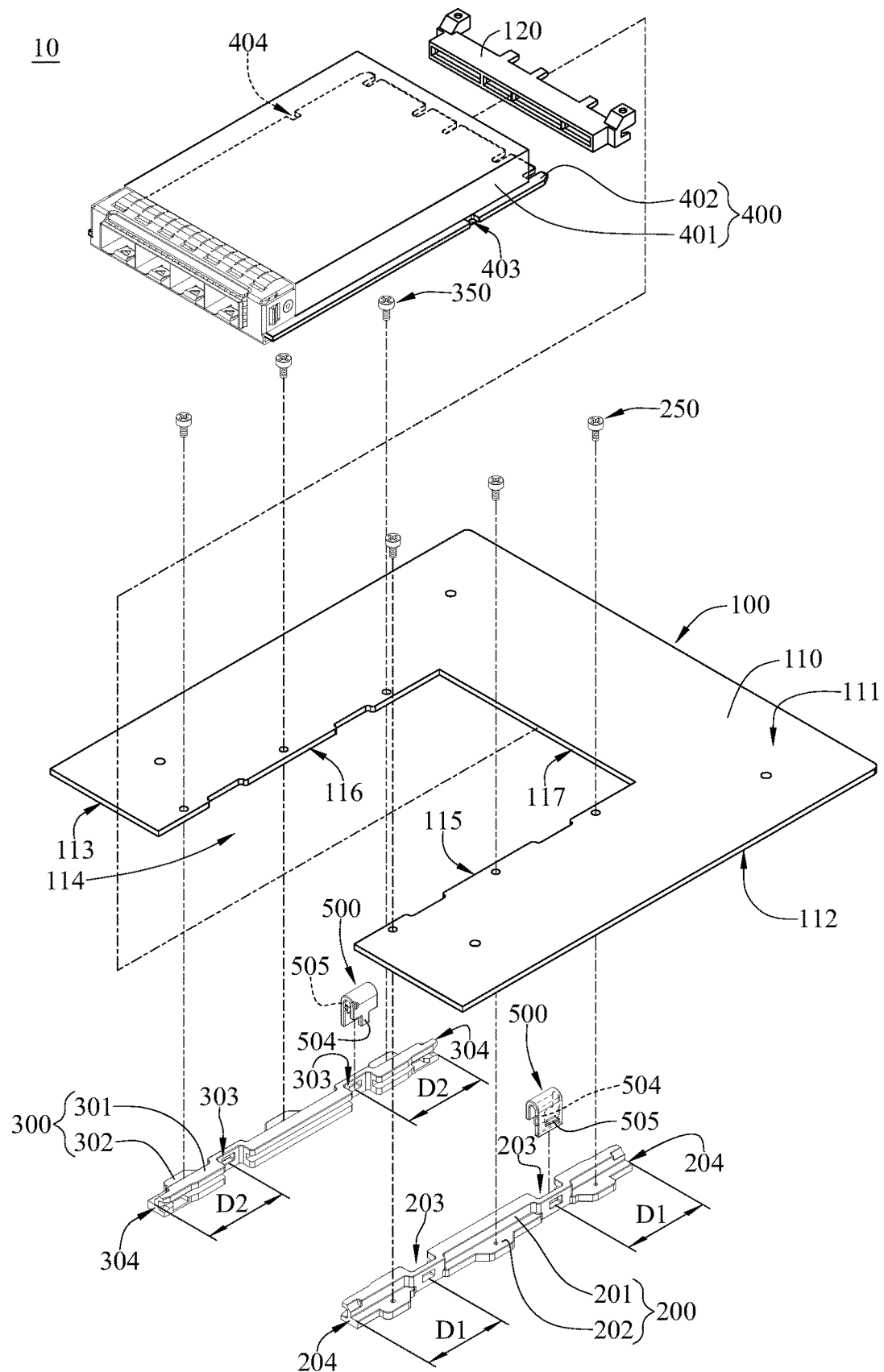
FIG. 2 is an exploded view of the electronic assembly in FIG. 1.

Please refer to FIGS. 1 and 2. FIG. 1 is a perspective view of an electronic assembly 10 according to a first embodiment of the invention. FIG. 2 is an exploded view of the electronic assembly 10 in FIG. 1.

In this embodiment, the electronic assembly 10 includes a motherboard 100, a first slide rail 200, a plurality of first screws 250, a second slide rail 300, a plurality of second screws 350, an expansion card 400 and two engagement components 500.

The motherboard 100 includes a main circuit board 110 and a first connector 120. In this embodiment, the main circuit board 110 has atop surface 111, a bottom surface 112, a side surface 113, a recess 114, a first inner surface 115, a second inner surface 116 and a third inner surface 117. The top surface 111 faces away from the bottom surface 112. The side surface 113 connects the top surface 111 with the bottom surface 112. The recess 114 penetrates through the top surface 111 and the bottom surface 112, and is recessed inward from the side surface 113. The first inner surface 115 faces toward the second inner surface 116. The third inner surface 117 connects the first inner surface 115 with the second inner surface 116. The recess 114 is formed by the first inner surface 115, the second inner surface 116 and the third inner surface 117. The first connector 120 is, for example, a splint connector. The first connector 120 is fixed to the third inner surface 117 of the main circuit board 110. Also, the first connector 120 is electrically connected to the main circuit board 110.

Figure 3:
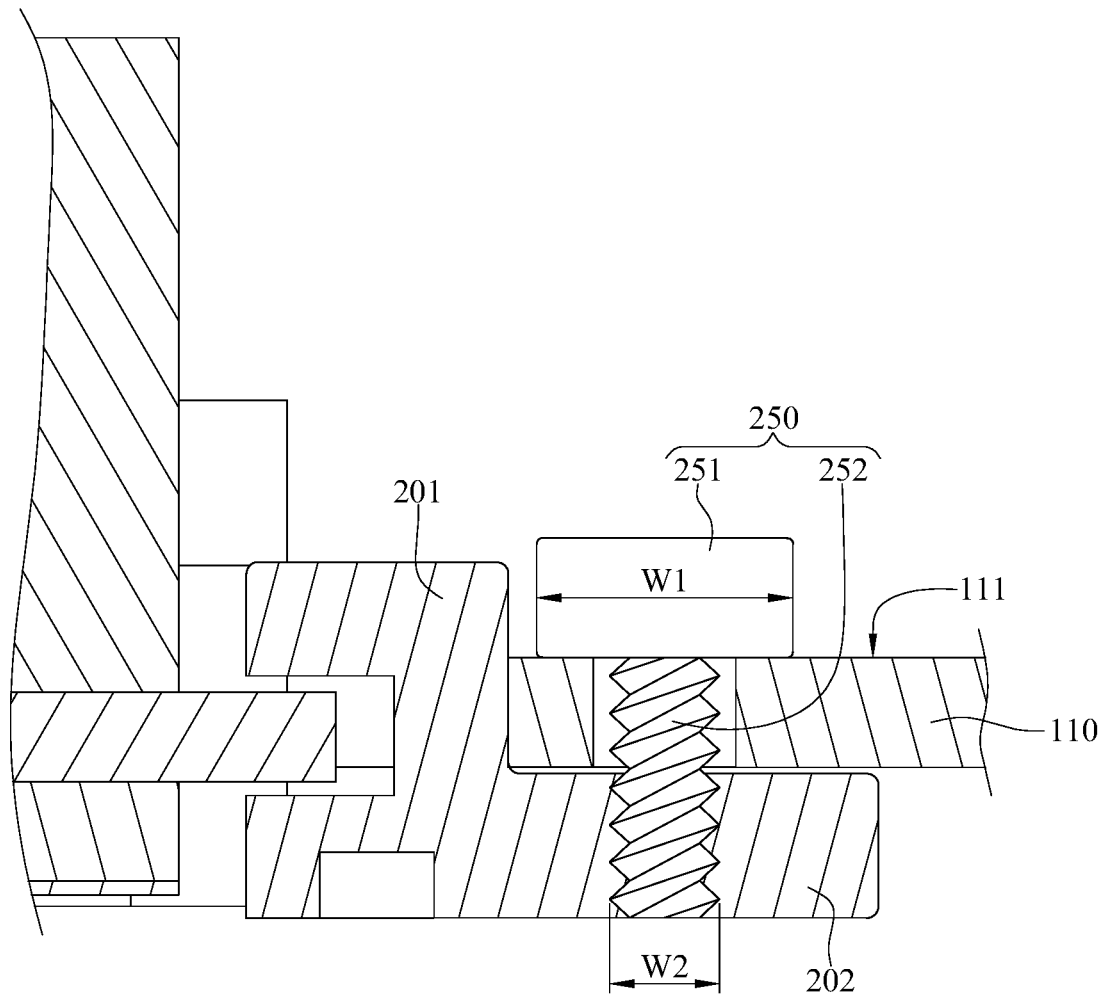
FIG. 3 is a partially enlarged cross-sectional view of the electronic assembly in FIG. 1.

Please refer to FIGS. 1 to 3, where FIG. 3 is a partially enlarged cross-sectional view of the electronic assembly in FIG. 1. The first slide rail 200 is fixed to the first inner surface 115 of the main circuit board 110 via the first screws 250, and the second slide rail 300 is fixed to the second inner surface 116 of the main circuit board 110 via the second screws 350.

In this embodiment, the first slide rail 200 includes a first body 201 and a plurality of first mounting protrusions 202. The first mounting protrusions 202 protrude from a side of the first body 201 that is located away from the second slide rail 300. In this embodiment, as shown in FIG. 3, the first screw 250 includes a first head part 251 and a first threaded part 252 that are connected to each other. A width W1 of the first head part 251 is larger than a width W2 of the first threaded part 252. As shown in FIG. 3, the first threaded part 252 is sequentially disposed through the main circuit board 110 and the first mounting protrusion 202 from the top surface 111 of the main circuit board 110 and is screwed into the first mounting protrusion 202, such that the main circuit board 110 is clamped between the first mounting protrusion 202 and the first head part 251.

In this embodiment, the second slide rail 300 includes a second body 301 and a plurality of second mounting protrusions 302. The second mounting protrusions 302 protrude from a side of the second body 301 that is located away from the first slide rail 200. Note that the fixation of the second slide rail 300 to the main circuit board 110 via the second screws 350 is similar to the fixation of the first slide rail 200 to the main circuit board 110 via the first screws 250, and thus the fixation of the second slide rail 300 to the main circuit board 110 will not be repeatedly introduced hereinafter.

In this embodiment, the first body 201 has two first engagement holes 203 and two opposite first end surfaces 204. The two first engagement holes 203 are respectively spaced apart from the two first end surfaces 204 by a first distance D1. In this embodiment, the second body 301 has two second engagement holes 303 and two opposite second end surfaces 304. The two second engagement holes 303 are respectively spaced apart from the two second end surfaces 304 by a second distance D2. In this embodiment, the first distance D1 is equal to the second distance D2. With such a configuration, the first body 201 and the second body 301 can be made by the same mold, thereby reducing the manufacture cost of the first slide rail 200 and the second slide rail 300.

Note that in other embodiments, the electronic assembly may include only one first screw and only one second screw. In still other embodiments, the electronic assembly may not include the first screw and the second screw, and the first slide rail and the second slide rail may be adhered to the main circuit board.

In addition, in other embodiments, the first distance between the first engagement hole and the first end surface may be different from the second distance between the second engagement hole and the second end surface.

The expansion card 400 includes an expansion circuit board 401 and a second connector 402. The second connector 402 is fixed on and electrically connected to the expansion circuit board 401. The expansion circuit board 401 is disposed on the first body 201 of the first slide rail 200 and the second body 301 of the second slide rail 300, and is located in the recess 114. In this embodiment, the expansion circuit board 401 has a first positioning recess 403 and a second positioning recess 404 that are spaced apart from each other. Furthermore, in this embodiment, the expansion circuit board 401 is, for example, a network card meeting OCP 3.0 specification. The second connector 402 is plugged into the first connector 120 of the motherboard 100.

Figure 4:
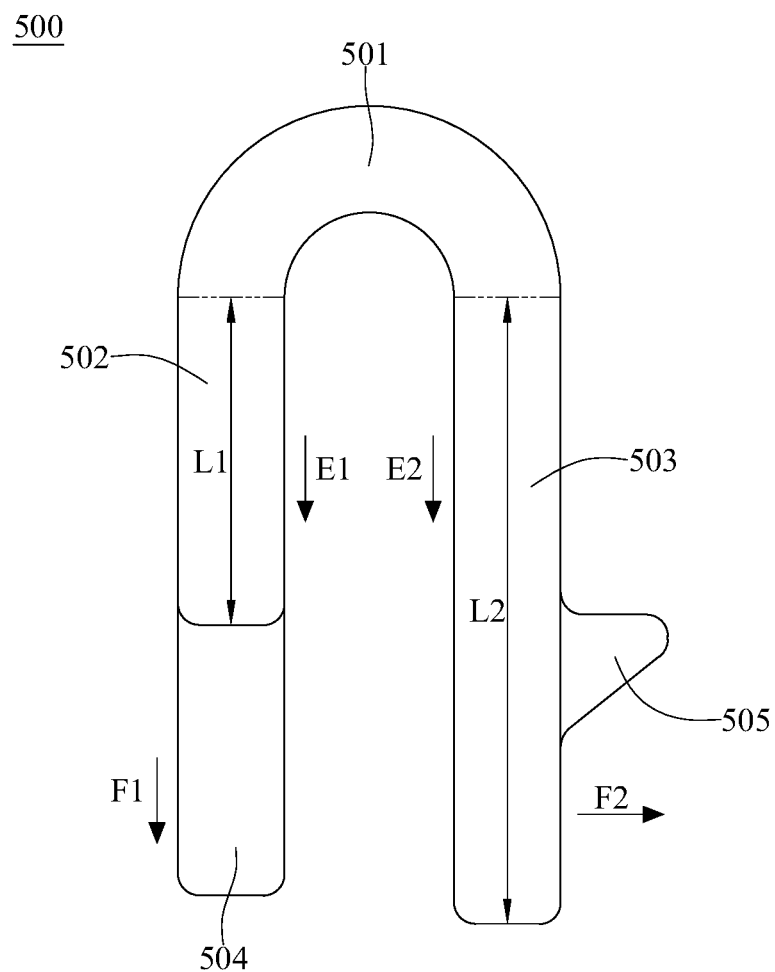
FIG. 4 is a side view of an engagement component of the electronic assembly in FIG. 1.

Since the two engagement components 500 are similar in structure, only the detail structure of one of them is described below. Please refer to FIGS. 2 and 4, where FIG. 4 is a side view of an engagement component of the electronic assembly in FIG. 1.

The engagement component 500 includes a connecting portion 501, a first movable end portion 502, a second movable end portion 503, a first protruding portion 504 and a second protruding portion 505. The first movable end portion 502 and the second movable end portion 503 are respectively connected to two opposite sides of the connecting portion 501. Further, in this embodiment, the first movable end portion 502 and the second movable end portion 503 are spaced apart from each other, and an extension direction E1 of the first movable end portion 502 is substantially parallel to an extension direction E2 of the second movable end portion 503. Further, in this embodiment, the extension direction E1 is the same as the extension direction E2. Moreover, the first movable end portion 502 protrudes from the connecting portion 501 by a first protruding length L1, and the second movable end portion 503 protrudes from the connecting portion 501 by a second protruding length L2. In this embodiment, the first protruding length L1 is smaller than the second protruding length L2. The first protruding portion 504 protrudes from a side of the first movable end portion 502 that is located away from the connecting portion 501 along a first protruding direction F1, and the second protruding portion 505 protrudes from a side of the second movable end portion 503 that is located away from the connecting portion 501 along a second protruding direction F2. In this embodiment, the first protruding direction F1 is substantially perpendicular to the second protruding direction F2.

In this embodiment, the engagement component 500 is made of, for example, plastic material, but the invention is not limited thereto. In other embodiments, the engagement component may be made of other flexible materials.

In other embodiments, the extension direction of the first movable end portion may be at an acute angle to the extension direction of the second movable end portion or the geometric relationship between these two extension directions may be adjusted according to actual requirements. In other embodiments, the first protruding length of the first movable end portion may be greater than or equal to the second protruding length of the second movable end portion. In other embodiments, the first protruding direction of the first protruding portion may be at an acute angle to the second protruding direction of the second protruding portion or the geometric relationship between these two protruding directions may be adjusted according to actual requirements.

The two first protruding portions 504 of the two engagement components 500 are respectively and removably engaged with the first positioning recess 403 and the second positioning recess 404 of the expansion circuit board 401. The two second protruding portions 505 of the two engagement components 500 are respectively and removably engaged with one of the two first engagement holes 203 and one of the two second engagement holes 303.

Note that in other embodiments, the electronic assembly may have only one engagement component, and in such embodiments, the expansion circuit board may not have the second positioning recess 404, and the second body of the second slide rail may not have the second engagement holes 303.

Figure 5:
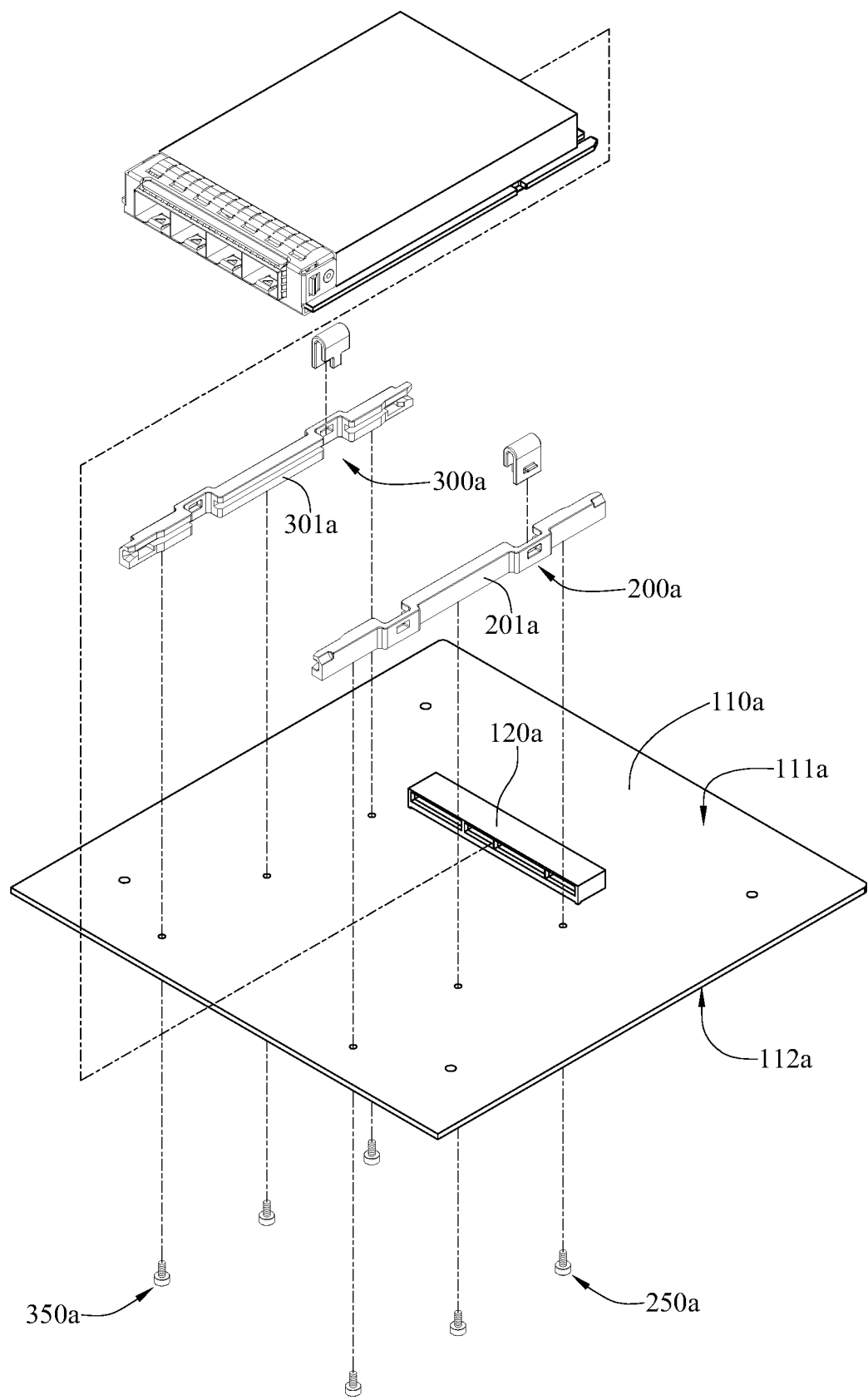
FIG. 5 is an exploded view of an electronic assembly according to a second embodiment of the invention.
Figure 6:
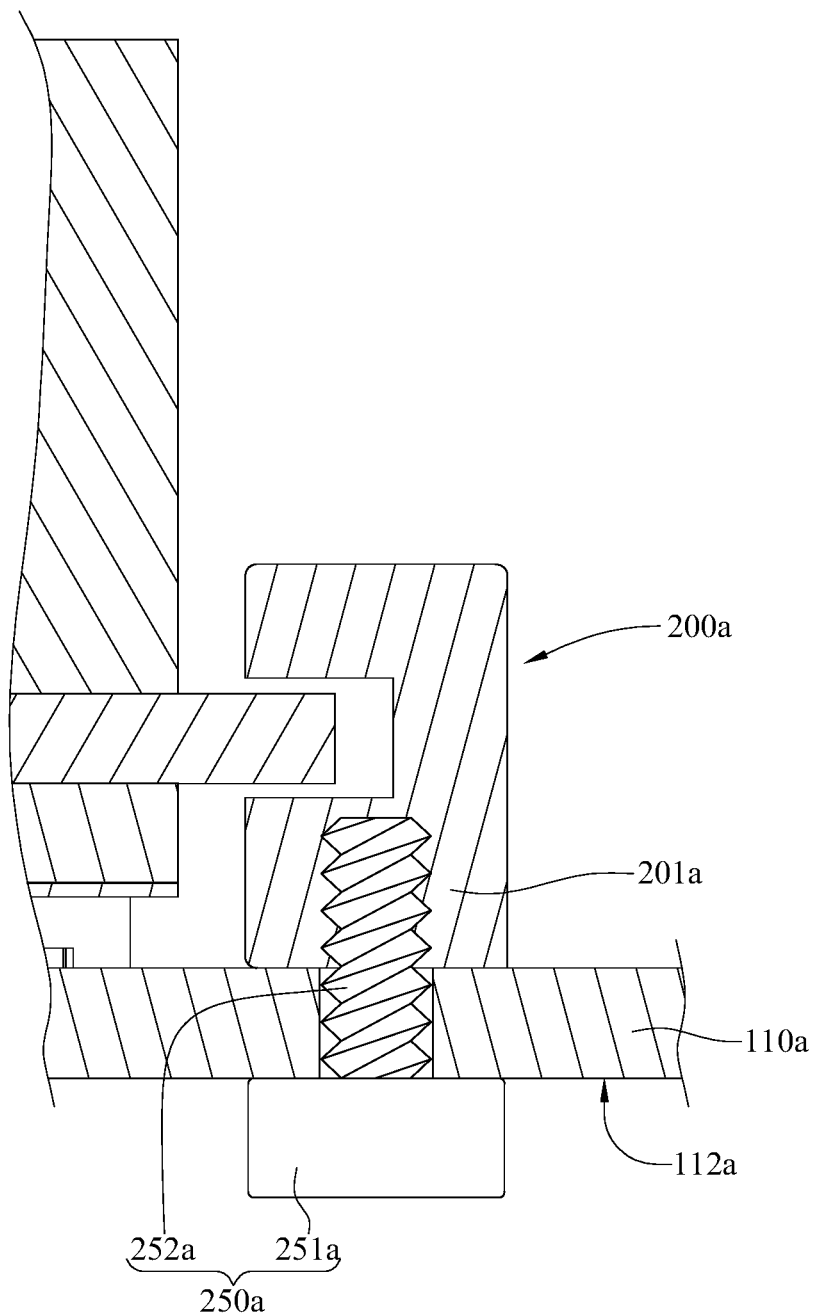
FIG. 6 is a partially enlarged cross-sectional view of the electronic assembly in FIG. 5.

The main circuit board 110 is not limited to have the recess 114. Please refer to FIGS. 5 and 6. FIG. 5 is an exploded view of an electronic assembly according to a second embodiment of the invention. FIG. 6 is a partially enlarged cross-sectional view of the electronic assembly in FIG. 5. The main difference between the first embodiment and the second embodiment is the structures of the motherboard, the first slide rail and the second slide rail and the connection relationships therebetween. Thus, only the aforementioned main difference will be described below.

In this embodiment, a main circuit board 110a does not have the recess 114 shown in FIG. 2. In this embodiment, a first connector 120a is, for example, an on-board connector. The first connector 120a, a first slide rail 200a and a second slide rail 300a are fixed on a top surface 111a of the main circuit board 110a. In this embodiment, the first slide rail 200a include a first body 201a but does not include the first mounting protrusions 202 shown in FIG. 2, and the second slide rail 300a include a second body 301a but does not include the second mounting protrusions 302 shown in FIG. 2.

In this embodiment, as shown in FIG. 6, a first threaded part 252a is sequentially disposed through the main circuit board 110a and the first body 201a of the first slide rail 200a from a bottom surface 112a of the main circuit board 110a and is screwed into the first body 201a of the first slide rail 200a, such that the main circuit board 110a is clamped between the first body 201a of the first slide rail 200a and the first head part 251a.

Note that since the fixation of the second slide rail 300a to the main circuit board 110a via a plurality of second screws 350a is similar to the fixation of the first slide rail 200a to the main circuit board 110a via a plurality of first screws 250a, only the fixation of the first slide rail 200a to the main circuit board 110a via the first screws 250a will be described in detail below.

According to the electronic assembly disclosed by the above embodiments, the first protruding portion of the engagement component is engaged with the first positioning recess of the expansion circuit board and the second protruding portion of the engagement component is engaged with the first engagement holes of the first slide rail. Thus, the expansion circuit board can be stably mounted on the first slide rail and the second slide rail.

Also, the expansion circuit board is fixed to the slide rails via the engagement component instead of being fixed to the chassis, such that the engagement component is not required to protrude out of the chassis, thereby preventing the engagement component from being unexpectedly moved and thus preventing the expansion circuit board from being unexpectedly removed from the first connector.

Moreover, the engagement component can be installed on or removed from the first slide rail and the expansion circuit board by squeezing the first movable end portion and the second movable end portion, such that the installation and removal of the expansion circuit board is convenient and tool-less.

Additionally, the first slide rail and the second slide rail can provide installation for various types of the expansion circuit board.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. An electronic assembly, comprising:
    a motherboard, comprising a main circuit board and a first connector, wherein the first connector is fixed on and electrically connected to the main circuit board;
    a first slide rail and a second slide rail, fixed on the main circuit board, wherein the first slide rail has a first engagement hole;
    an expansion card, comprising an expansion circuit board and a second connector, wherein the second connector is fixed on and electrically connected to the expansion circuit board, the expansion circuit board is disposed on the first slide rail and the second slide rail and has a first positioning recess, the second connector is plugged into the first connector of the motherboard; and
    at least one engagement component, comprising a connecting portion, a first movable end portion, a second movable end portion, a first protruding portion, and a second protruding portion, wherein the first movable end portion and the second movable end portion are respectively connected to two opposite sides of the connecting portion, the first protruding portion protrudes from the first movable end portion and is removably engaged with the first positioning recess of the expansion circuit board, the second protruding portion protrudes from the second movable end portion and is removably engaged with the first engagement hole of the first slide rail;
    wherein the first movable end portion protrudes from the connecting portion by a first protruding length, the second movable end portion protrudes from the connecting portion by a second protruding length, the first protruding length is smaller than the second protruding length.

2. The electronic assembly according to claim 1, wherein the main circuit board has a top surface and a bottom surface that face away from each other, the first connector, the first slide rail, and the second slide rail are fixed on the top surface.

3. The electronic assembly according to claim 2, further comprising a first screw and a second screw, wherein the first screw comprises a first head part and a first threaded part that are connected to each other, a width of the first head part is greater than a width of the first threaded part, the first threaded part is sequentially disposed through the main circuit board and the first slide rail from the bottom surface of the main circuit board so that the main circuit board is clamped between the first slide rail and the first head part, the second screw comprises a second head part and a second threaded part that are connected to each other, a width of the second head part is greater than a width of the second threaded part, the second threaded part is sequentially disposed through the main circuit board and the second slide rail from the bottom surface of the main circuit board so that the main circuit board is clamped between the second slide rail and the second head part.

4. The electronic assembly according to claim 1, wherein the main circuit board of the motherboard has a top surface, a bottom surface, a side surface, a recess, a first inner surface, a second inner surface and a third inner surface, the top surface faces away from the bottom surface, the side surface connects the top surface with the bottom surface, the recess penetrates through the top surface and the bottom surface and is recessed inward from the side surface, the first inner surface faces toward the second inner surface, the third inner surface connects the first inner surface with the second inner surface, the recess is formed by the first inner surface, the second inner surface and the third inner surface, the first connector is fixed to the third inner surface, the first slide rail and the second slide rail are respectively fixed to the first inner surface and the second inner surface, the expansion circuit board is located in the recess.

5. The electronic assembly according to claim 4, further comprising a first screw and a second screw, wherein the first screw comprises a first head part and a first threaded part that are connected to each other, a width of the first head part is greater than a width of the first threaded part, the first slide rail comprises a first body and a first mounting protrusion, the first engagement hole is located on the first body, and the expansion circuit board is disposed on the first body, the first mounting protrusion protrudes from a side of the first body that is located away from the second slide rail, the first threaded part is sequentially disposed through the main circuit board and the first mounting protrusion from the top surface of the main circuit board so that the main circuit board is clamped between the first mounting protrusion and the first head part, the second screw comprises a second head part and a second threaded part that are connected to each other, a width of the second head part is greater than a width of the second threaded part, the second slide rail comprises a second body and a second mounting protrusion, the expansion circuit board is disposed in the second body, the second mounting protrusion protrudes from a side of the second body that is located away from the first slide rail, the second threaded part is sequentially disposed through the main circuit board and the second mounting protrusion from the top surface of the main circuit board so that the main circuit board is clamped between the second mounting protrusion and the second head part.

6. The electronic assembly according to claim 1, wherein the first movable end portion and the second movable end portion are spaced apart from each other, and an extension direction of the first movable end portion is substantially parallel to an extension direction of the second movable end portion.

7. The electronic assembly according to claim 1, wherein the first protruding portion protrudes from the first movable end portion along a first protruding direction, the second protruding portion protrudes from the second movable end portion along a second protruding direction, the first protruding direction is substantially perpendicular to the second protruding direction.

8. The electronic assembly according to claim 1, wherein the at least one engagement component comprises two engagement components, the second slide rail has a second engagement hole, the expansion circuit board further has a second positioning recess spaced apart from the first positioning recess, the two first protruding portions of the two engagement components are respectively and removably engaged with the first positioning recess and the second positioning recess, the two second protruding portions of the two engagement components are respectively and removably engaged with the first engagement hole and the second engagement hole.

9. The electronic assembly according to claim 8, wherein the first slide rail has two first engagement holes and two opposite first end surfaces, the second slide rail has two second engagement holes and two opposite second end surfaces, the two second protruding portions of the two engagement components are respectively and removably engaged with one of the two first engagement holes and one of the two second engagement holes, the two first engagement holes are respectively spaced apart from the two first end surfaces by a first distance, the two second engagement holes are respectively spaced apart from the two second end surfaces by a second distance, the first distance is equal to the second distance.

\* \* \* \* \*